United States Patent
Wu et al.

(10) Patent No.: US 9,015,554 B2
(45) Date of Patent: Apr. 21, 2015

(54) MANAGEMENT OF NON-VALID DECISION PATTERNS OF A SOFT READ RETRY OPERATION

(71) Applicant: Seagate Technology LLC, Cupertino, CA (US)

(72) Inventors: Yunxiang Wu, Cupertino, CA (US); Ning Chen, San Jose, CA (US); Jamal Riani, Fremont, CA (US); Hakim Alhussien, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 25 days.

(21) Appl. No.: 13/721,739

(22) Filed: Dec. 20, 2012

(65) Prior Publication Data

US 2014/0181617 A1 Jun. 26, 2014

(51) Int. Cl.
*H03M 13/45* (2006.01)
*H03M 13/00* (2006.01)
*H03M 13/37* (2006.01)
*H03M 13/53* (2006.01)
*H03M 13/11* (2006.01)

(52) U.S. Cl.
CPC ........ *H03M 13/612* (2013.01); *H03M 13/1111* (2013.01); *H03M 13/3723* (2013.01)

(58) Field of Classification Search
CPC ... H03M 13/15; H03M 13/151; H03M 13/43; H03M 13/19; H03M 13/2957; H03M 13/45; H03M 13/612; H03M 13/1111; H03M 13/3723; G06F 11/1076; G06F 11/1008; G06F 11/1068
See application file for complete search history.

(56) References Cited

U.S. PATENT DOCUMENTS

| | | | | |
|---|---|---|---|---|
| 5,491,479 | A * | 2/1996 | Wilkinson | 341/58 |
| 5,712,861 | A * | 1/1998 | Inoue et al. | 714/752 |
| 7,814,401 | B2 | 10/2010 | Alrod et al. | 714/794 |
| 7,966,550 | B2 | 6/2011 | Mokhlesi et al. | 714/780 |
| 8,099,652 | B1 | 1/2012 | Alrod et al. | 714/773 |
| 8,145,981 | B2 | 3/2012 | Mokhlesi et al. | 714/780 |
| 8,429,498 | B1 * | 4/2013 | Anholt et al. | 714/764 |
| 2011/0252283 | A1 | 10/2011 | Mokhlesi et al. | 714/719 |
| 2012/0066441 | A1 | 3/2012 | Weingarten | 711/103 |
| 2012/0230119 | A1 | 9/2012 | Chen et al. | 365/185.29 |
| 2012/0311388 | A1 * | 12/2012 | Cronin et al. | 714/42 |

* cited by examiner

*Primary Examiner* — April Y Blair
*Assistant Examiner* — Dipakkumar Gandhi
(74) *Attorney, Agent, or Firm* — Christopher P. Maiorana, PC

(57) ABSTRACT

An apparatus comprising a first circuit and a second circuit. The first circuit may be configured to generate an output signal in response to (i) a value retrieved from a look-up table, and (ii) an index signal. The second circuit may be configured to generate the index signal in response to a plurality of page signals. The apparatus may manage decision patterns during a soft retry.

20 Claims, 4 Drawing Sheets

# MANAGEMENT OF NON-VALID DECISION PATTERNS OF A SOFT READ RETRY OPERATION

The present application is related to co-pending U.S. application Ser. No. 13/464,433, filed May 4, 2012, co-pending U.S. application. Ser. No. 13/533,130, filed Jun. 26, 2012, and co-pending international application PCT/US2012/021682, international filing date of Jan. 18, 2012, all of which are incorporated by reference.

FIELD OF THE INVENTION

The present invention relates to storage devices generally and, more particularly, to a method and/or apparatus for implementing management of non-valid decision patterns during a soft read retry operation in a memory controller.

BACKGROUND OF THE INVENTION

Different threshold voltage levels map to different bits in nonvolatile memories. Due to noise, the actual threshold voltage levels for each state within a group of cells follow a distribution. Controllers of the nonvolatile memory will model the threshold voltage distribution of each state. Conventional controllers use a parametric model for a "flash channel". The flash channel parameters change with use conditions, such as program/erase cycles and retention. Therefore, the controllers track the channel parameters over time. However, the tracking operations consume bandwidth to the memory and utilize storage space for maintaining the channel parameters.

With aggressive scaling down of process technologies, the raw bit error rate (BER) of conventional NAND flash memories is becoming less reliable. To maintain the same level of reliability previously achieved before scaling down, Solid State Drive (SSD) controllers are adopting soft decoded error correction codes, such as low density parity check (LDPC) codes. Such codes are powerful in correcting errors, but need the input to the decoder to be a soft decision of the flash channels. A soft decision normally takes the form of log-likelihood ratio (LLR). In order to obtain a high quality of a soft decision, multiple reads, often with varying read voltages, are necessary.

It would be desirable to implement the management of non-valid decision patterns of soft read retry.

SUMMARY OF THE INVENTION

The present invention concerns an apparatus comprising a first circuit and a second circuit. The first circuit may be configured to generate an output signal in response to (i) a value retrieved from a look-up table, and (ii) an index signal. The second circuit may be configured to generate the index signal in response to a plurality of page signals. The apparatus may manage decision patterns during a soft retry operation.

The features and advantages of the present invention include providing an apparatus that may (1) provide management of non-valid decision patterns of soft read retry operations, (ii) be implemented in a solid state drive controller, and/or (iii) be easy to implement.

BRIEF DESCRIPTION OF THE DRAWINGS

These and other features and advantages of the present invention will be apparent from the following detailed description and the appended claims and drawings in which:

DETAILED DESCRIPTION OF THE PREFERRED EMBODIMENTS

An embodiment of the invention may be described in the context of reading a multi-level cell (MLC) lower page flash memory. However, the invention may be applied to other type of flash devices. Gray mapping (e.g., 3/1/0/2) is discussed in various examples. In one example, read voltages, decision regions, hard decision patterns and non-valid hard decision patterns are shown.

Figure 1:
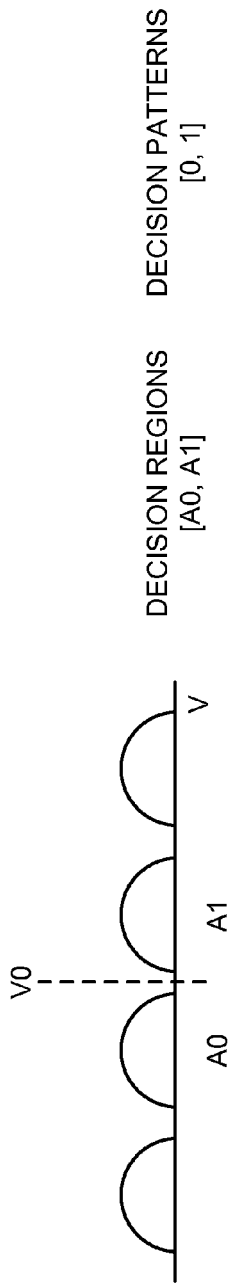
FIG. 1 is a diagram illustrating a normal read operation of a lower page of a multi-level cell.

Referring to FIG. 1, a normal read of a lower page of a MLC cell is shown. A read voltage V0 is shown dividing the voltage axis of the cell (horizontal) into two decision regions (e.g., A0 and A1). The corresponding decisions are shown as 1 or 0, respectively. Soft decisions corresponding to 1 or 0 may be obtained if the four distribution parameters are considered. The soft decision with a single read is a fairly rough approximation. A higher quality of soft decisions may be obtained with more reads.

Figure 2:
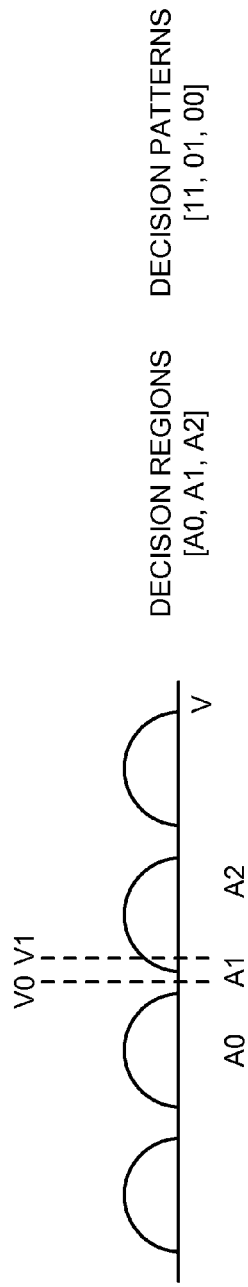
FIG. 2 is a diagram illustrating decision regions and corresponding hard decision patterns for two read operations.

Referring to FIG. 2 an example of decision regions and corresponding hard decision patterns for two read operations is shown. The circuit 106 (to be described in connection with FIG. 4) is responsible for generating a log-likelihood ratio (LLR) lookup table (LUT) for all valid hard decision patterns. The circuit 102 may generate the hard decision patterns based on the multiple page (read) inputs. If non-valid hard decision pattern are present, the circuit 102 is responsible to manage the non-valid pattern to a valid pattern (or erasure). At the output of the circuit 102, each hard decision pattern is represented by an index (4-bit for 7 input pages reads). The circuit 104 performs the look up operation from an index to a LLR value (e.g., the signal SOFT OUTPUT).

Figure 3:
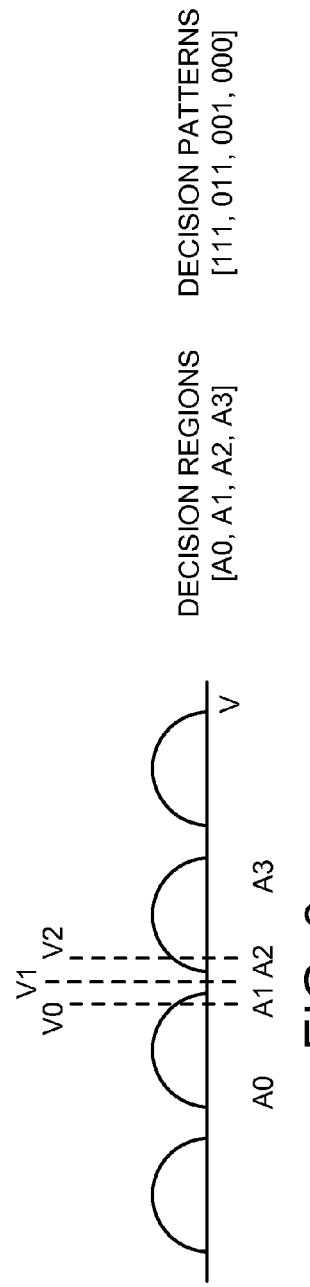
FIG. 3 is a diagram illustrating decision regions and corresponding hard decision patterns for three read operations.

Referring to FIG. 3 an example of decision regions and the corresponding hard decision patterns for three reads is shown. The non-valid decision patterns may be one of [100, 110, 101, 010]. The number of decision patterns shown is N+1, which may represent N reads of a lower page. For an upper page, there may be 2*N hard decision patterns, since a pair of read voltages is used for each read. The following TABLE 1 and TABLE 2 list a number of possible decision patterns with up to seven reads for lower and upper pages, respectively. The patterns are listed assuming each read uses higher voltage than a previous read.

TABLE 1

| | | | LSB FUNCTION | | | | | |
|---|---|---|---|---|---|---|---|---|
| # Reads | Pattern | Index | # Inputs | Pattern | Index | # Reads | Pattern | Index |
| 2 | 11 | 0 | 3 | 111 | 0 | 4 | 1111 | 0 |
|   | 01 | 1 |   | 011 | 1 |   | 0111 | 1 |
|   | 00 | 2 |   | 001 | 2 |   | 0011 | 2 |
|   |    |   |   | 000 | 3 |   | 0001 | 3 |
|   |    |   |   |     |   |   | 0000 | 4 |
| 5 | 11111 | 0 | 6 | 111111 | 0 | 7 | 1111111 | 0 |
|   | 01111 | 1 |   | 011111 | 1 |   | 0111111 | 1 |
|   | 00111 | 2 |   | 001111 | 2 |   | 0011111 | 2 |
|   | 00011 | 3 |   | 000111 | 3 |   | 0001111 | 3 |
|   | 00001 | 4 |   | 000011 | 4 |   | 0000111 | 4 |
|   | 00000 | 5 |   | 000001 | 5 |   | 0000011 | 5 |
|   |       |   |   | 000000 | 6 |   | 0000001 | 6 |
|   |       |   |   |        |   |   | 0000000 | 7 |

TABLE 2

| | | | MSB FUNCTION | | | | | |
|---|---|---|---|---|---|---|---|---|
| # Reads | Pattern | Index | # Inputs | Pattern | Index | # Reads | Pattern | Index |
| 2 | 11 | 0 | 3 | 111 | 0 | 4 | 1111 | 0 |
|   | 01 | 1 |   | 011 | 1 |   | 0111 | 1 |
|   | 00 | 2 |   | 001 | 2 |   | 0011 | 2 |
|   | 10 | 3 |   | 000 | 3 |   | 0001 | 3 |
|   |    |   |   | 100 | 4 |   | 0000 | 4 |
|   |    |   |   | 110 | 5 |   | 1000 | 5 |
|   |    |   |   |     |   |   | 1100 | 6 |
|   |    |   |   |     |   |   | 1110 | 7 |
| 5 | 11111 | 0 | 6 | 111111 | 0 | 7 | 1111111 | 0 |
|   | 01111 | 1 |   | 011111 | 1 |   | 0111111 | 1 |
|   | 00111 | 2 |   | 001111 | 2 |   | 0011111 | 2 |
|   | 00011 | 3 |   | 000111 | 3 |   | 0001111 | 3 |
|   | 00001 | 4 |   | 000011 | 4 |   | 0000111 | 4 |
|   | 00000 | 5 |   | 000001 | 5 |   | 0000011 | 5 |
|   | 10000 | 6 |   | 000000 | 6 |   | 0000001 | 6 |
|   | 11000 | 7 |   | 100000 | 7 |   | 0000000 | 7 |
|   | 11100 | 8 |   | 110000 | 8 |   | 1000000 | 8 |
|   |       | 9 |   | 111000 | 9 |   | 1100000 | 9 |
|   |       |   |   | 111100 | 10 |   | 1110000 | 10 |
|   |       |   |   | 111110 | 11 |   | 1111000 | 11 |
|   |       |   |   |        |   |   | 1111100 | 12 |
|   |       |   |   |        |   |   | 1111110 | 13 |

Unexpected hard decision patterns tend to occur randomly. The frequency of the hard decision patterns varies with the values of read voltages, program-erase cycles, retention, and/or other factors. The hard decision patterns may be referred to as non-valid decision patterns. The cause of the non-valid decision patterns may be related to read noise.

Note that soft channel decisions are produced for decision regions. When a cell is read multiple times, the controller receives a hard decision pattern. Due to the one-to-one mapping between decision regions and (valid) decision patterns, the circuit 100 (to be described in connection with FIG. 4) may infer which decision region the voltage of the cell falls in. A soft decision may be assigned to the corresponding hard decision pattern. In general, when a non-valid pattern is received, there is no straightforward way to assign a soft decision value to the pattern without the circuit 100.

Figure 4:
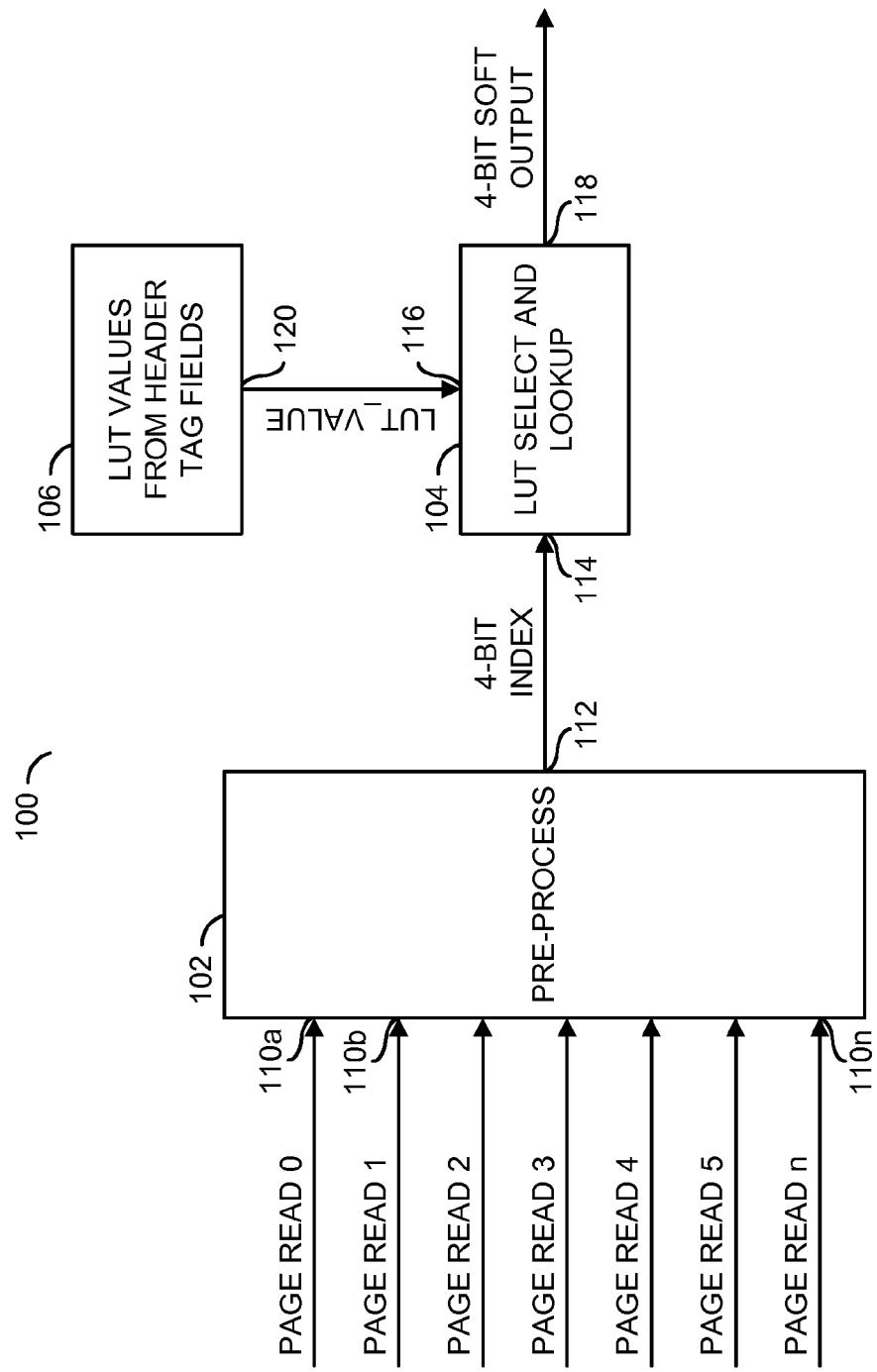
FIG. 4 is a block diagram of an embodiment of the present invention.

Referring to FIG. 4, a block diagram of a circuit 100 is shown in accordance with an embodiment of the present invention. The circuit 100 generally comprises a block (or circuit) 102, a block (or circuit) 104 and a block (or circuit) 106. The circuit 102 may be implemented as a pre-processing circuit. The circuit 104 may be implemented as a select and/or look-up table circuit. The circuit 106 may be implemented as a look-up table. The circuit 102 may have a number of inputs 110a-110n and an output 112. The circuit 104 may have an input 114, an input 116 and an output 118. The circuit 106 may have an output 120.

In one example, the circuit 106 may generate values from a number of headers received from a number of tag fields to send on the output 120. The circuit 104 may generate the signal OUTPUT in response to signal (e.g., LUT_VALUE) received on the input 116 and the signal (e.g., INDEX) received on the input 114. The circuit 102 may generate the signal INDEX in response to a number of input signals (e.g., page 0, page 1, . . . page 6) received on the inputs 110a-110n. The inputs PAGE READ 0 to PAGE READ n represent the bit sequences read from the same page with varying read voltages. While seven page reads are shown (PAGE READ 0 to PAGE READ n), the particular number of page reads may be varied to meet the design criteria of a particular implementation. Each time a page is read, a bit sequence (raw decision) is obtained. Each bit represents the value of a cell. After multiple reads, a combination of the bit sequences is used to obtain a (multiple bits) hard decision pattern for each cell. The signal INDEX may be implemented, in one example, as a 4-bit signal. The signal OUTPUT may be implemented, in one example, as a 4-bit signal. However, the particular bit-width of the signal OUTPUT and the signal INDEX may be varied to make the design criteria of a particular implementation.

The circuit 100 may be used to improve performance of an SSD controller employing soft decoding error correction codes. Conventional controllers have used BCH code (Bose and Ray-Chaudhuri) as the error correcting codes (ECC), where each retry read is considered as an independent read. Therefore there are no non-valid decision patterns occur conventional controllers. However, such conventional controllers tend to use more processing resources than needed.

The circuit 100 may implement a non-valid pattern management scheme. Non-valid patterns may be caused by read noise. The source of the noise may involve many known factors. As process technologies scale down, non-valid patterns are not insignificant events. The circuit 100 provides a scheme to handling non-valid decision patterns. Ideally, non-valid patterns should not be present when a page is read multiple times with varying read voltages. The circuit 100 may provide a management scheme that contains the two levels, generally described as Level 1 and Level 2.

In a Level 1 example, non-valid patterns may be viewed as erasures. For example, in addition to the valid decision patterns, there is always a valid decision pattern called E (e.g., which generally stands for erasure). E does not normally correspond to any decision regions. In general, no soft decision values are calculated for E. At this management level, all non-valid patterns are viewed as E. Since E cannot be mapped to a particular decision region, a value of LLR=0 is assigned for E.

In a Level 2 example, mapping to nearest valid patterns may be implemented. For example, when there are too many non-valid patterns, simply setting the signal LLR=0 for the patterns will degrade the error rate after ECC, especially at or near the error floor region of LDPC decoder. Therefore, more complicated treatment may be implemented if similar error rates need to be maintained. To a non-valid pattern, the circuit 100 may find a minimum Hamming distance to valid patterns. Based on the number of the valid patterns, the following examples show actions that may be taken.

EXAMPLE 1

Suppose the number of reads with varying read voltages is 7 (TABLE 1). A received non-valid pattern may be denoted as 0001001. The valid pattern with minimum Hamming distance is shown as 0000001. The distance is 1. In such an example, there is only one candidate shown as valid pattern. Therefore, the value 0001001 is mapped to 0000001.

EXAMPLE 2

Suppose number of reads with varying read voltages is 7 (TABLE 1). A received non-valid pattern may be denoted as 0000101. In this case, two valid patterns with minimum Hamming distance of 1 are available (e.g., 0000111 and 0000001). If the read noise is matched as a Gaussian distribution, a simple analysis shows that most possible valid patterns are actually located between 0000111 and 0000001 in TABLE 1 (e.g., 0000011). Therefore, when there are multiple valid patterns with minimum Hamming distance, the non-valid pattern is generally mapped to the pattern located between them. In practice with approximation, the non-valid pattern may also be mapped to either one of the two valid patterns.

In general, non-valid patterns with minimum distance greater than 1 are exponentially rare. At level 2 management, the non-valid patterns may be mapped according to example 1 and 2. The balance of non-valid patterns may be mapped to erasures. Depending on the frequency of non-valid pattern, either level 1 or level 2 mapping may be chosen.

In one example, the backend of the controller may be designed as shown in FIG. 4. In one example, after seven reads, the data patterns are feed into the pre-processing block in parallel (e.g., page 0 to page 6). The pre-processing block is where non-valid patterns are handled and/or processed. After pre-processing, all non-valid patterns should either be a valid pattern or an erasure. Then the preprocessed patterns are mapped to soft decisions using the LLR table 106.

Figure 5:
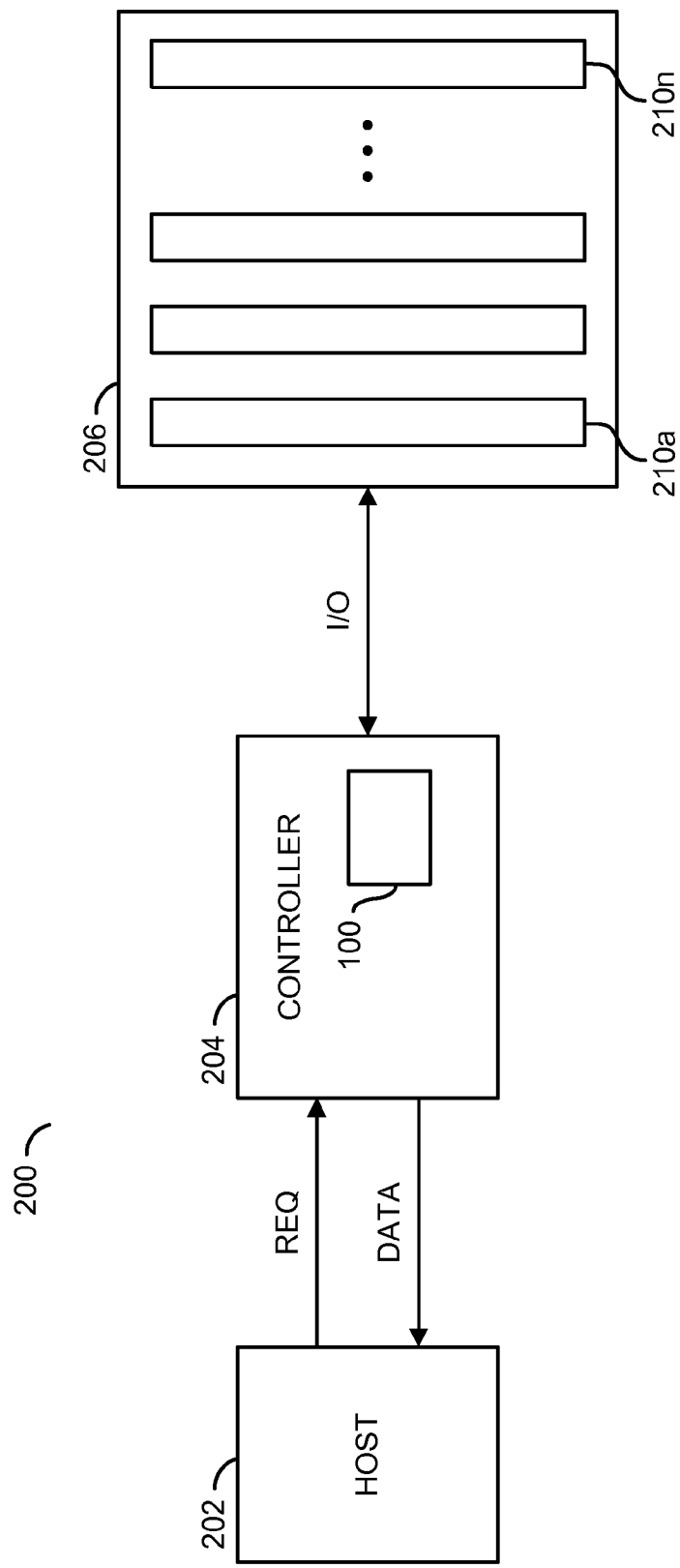
FIG. 5 is a diagram illustrating a context of an embodiment of the invention.

Referring to FIG. 5, a block diagram of an example apparatus 200 is shown. The apparatus 200 may implement a computer having a nonvolatile memory circuit. The apparatus 200 generally comprises a block (or circuit) 202, a block (or circuit) 204 and a block (or circuit) 206. The circuit 204 may include the circuit 100.

A signal (e.g., REQ) may be generated by the circuit 202. The signal REQ may be received by the circuit 204. The signal REQ may be a request signal that may be used to access data from the circuit 206. A signal (e.g., I/O) may be generated by the circuit 204 to be presented to the circuit 206. The signal REQ may include one or more address bits. A signal (e.g., DATA) may be one or more data portions received by the circuit 202.

The circuit 202 is shown implemented as a host circuit. The circuit 202 reads and writes data to and from the circuit 206. The circuit 206 is generally implemented as a nonvolatile memory circuit. The circuit 206 may include a number of modules 210a-210n. The modules 210a-210n may be implemented as NAND flash chips. In some embodiments, the circuit 206 may be a NAND flash device. In other embodiments, the circuit 204 and/or the circuit 206 may be implemented as all or a portion of a solid state drive having one or more nonvolatile devices. The circuit 206 is generally operational to store data in a nonvolatile condition. When data is read from the circuit 206, the circuit 202 may access a set of data (e.g., multiple bits) identified in the signal REQ.

In some embodiments, the circuit 206 may be implemented as a single-level cell (e.g., SLC) type circuit. An SLC type circuit generally stores a single bit per memory cell (e.g., a logical 0 or 1). In other embodiments, the circuit 206 may be implemented as a multi-level cell (e.g., MLC) type circuit. An MLC type circuit is generally capable of storing multiple (e.g., two) bits per memory cell (e.g., logical 00, 01, 10 or 11). In still other embodiments, the circuit 206 may implement a triple-level cell (e.g., TLC) type circuit. A TLC circuit may be able to store multiple (e.g., three) bits per memory cell (e.g., a logical 000, 001, 010, 011, 100, 101, 110 or 111).

The signal REQ generally spans an address range of the circuit 206. The address range may be divided into multiple groups (or regions). Each group may be divided into one or more sets of data. Each set of data generally incorporates multiple memory cells. The signal WCW may write an entire set (or ECC codeword) into the circuit 206. The signal RCW may read an entire set (or ECC codeword) from the circuit 206.

Figure 6:
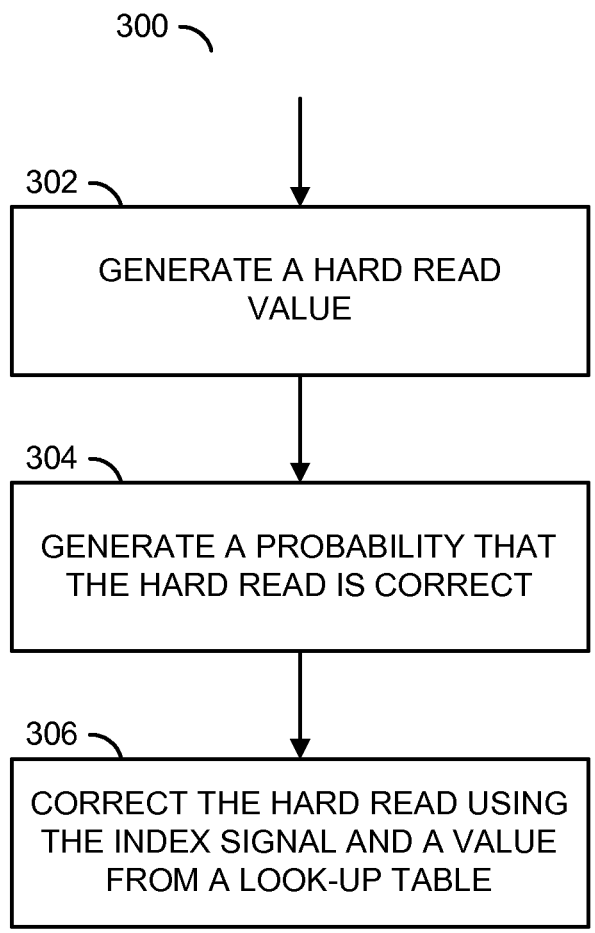
FIG. 6 is a flow diagram of an embodiment of the invention.

Referring to FIG. 6, a flow diagram on an example embodiment is shown. The flow diagram 300 generally comprises a step (or state) 302, a step (or state) 304, and a step (or state) 306. The step 302 may generate a hard read from a memory. The step 304 may generate a probability that the hard read is correct. The step 306 corrects the hard read using an index signal and a value retrieve from a look-up table.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to the preferred embodiments thereof, it will be understood by those skilled in the art that various changes in form and details may be made without departing from the scope of the invention.

The invention claimed is:

1. An apparatus comprising:
a first circuit configured to generate an output value by addressing a look-up table with an index signal, wherein said output value is useable in a soft decode of data; and
a second circuit configured to generate said index signal in response to (i) a plurality of bits received from a plurality of hard reads of said data from a memory cell over a plurality of voltages, wherein a sequence of said bits forms a decision pattern, (ii) a determination of a validity of said decision pattern based on a number of said hard reads and (iii) a correction of said decision pattern if said decision pattern is determined to be invalid, wherein said index signal identifies one of a plurality of valid patterns that matches said decision pattern.

2. The apparatus according to claim 1, wherein said index signal comprises a multi-bit index signal.

3. The apparatus according to claim 1, wherein (i) said look-up table stores a plurality of soft values received from a third circuit, and (ii) said output value is one of said soft values identified by said index signal.

4. The apparatus according to claim 1, wherein said apparatus is implemented as part of a memory controller.

5. The apparatus according to claim 4, wherein said memory controller comprises a solid state drive memory controller.

6. The apparatus according to claim 1, wherein said correction adjusts said decision pattern to an erasure state of one of said valid patterns.

7. The apparatus according to claim 1, wherein said correction is based on a probability that said decision pattern is one of said valid patterns with one or more errors in said sequence of said bits.

8. The apparatus according to claim 7, wherein said probability is determined by a number of said bits in said decision pattern that are flipped relative to said one valid pattern.

9. The apparatus according to claim 1, wherein said correction adjusts said decision pattern to one of said valid patterns with a lowest number of said bits that are flipped relative to said valid patterns.

10. The apparatus according to claim 9, wherein said one valid pattern has a minimum Hamming distance from said decision pattern.

11. The apparatus according to claim 1, wherein said correction adjusts said decision pattern to one of said valid patterns between two of said valid patterns both with a lowest number of said bits that are flipped relative to said valid patterns.

12. A method for management of non-valid decision patterns, comprising the steps of:
(A) receiving a plurality of bits from a plurality of hard reads of data from a memory cell over a plurality of voltages, wherein a sequence of said bits forms a decision pattern;
(B) generating an index signal in response to (i) a determination of a validity of said decision pattern based on a number of said hard reads and (ii) a correction of said decision pattern if said decision pattern is determined to be invalid, wherein said index signal identifies one of a plurality of valid patterns that matches said decision pattern; and
(C) generating an output value by addressing a look-up table with said index signal, wherein said output value is useable in a soft decode of data.

13. The method according to claim 12, wherein said correction adjusts said decision pattern to an erasure state of one of said valid patterns.

14. The method according to claim 12, wherein said correction is based on a probability that said decision pattern is one of said valid patterns with one or more errors in said sequence of said bits.

15. The method according to claim 14, wherein said probability is determined by a number of said bits in said decision pattern that are flipped relative to said one valid pattern.

16. The method according to claim 12, wherein said correction adjusts said decision pattern to one of said valid patterns with a lowest number of said bits that are flipped relative to said valid patterns.

17. The method according to claim 12, wherein said correction adjusts said decision pattern to one of said valid patterns between two of said valid patterns both with a lowest number of said bits that are flipped relative to said valid patterns.

18. The method according to claim 12, wherein said validity of said decision pattern is further based on a current one of a plurality of pages in said memory cell where said data is stored.

19. An apparatus comprising:
a memory configured to process a plurality of read/write operations; and
a controller configured to (i) receive a plurality of bits from a plurality of hard reads of data from a memory cell of said memory over a plurality of voltages, wherein a sequence of said bits forms a decision pattern, (ii) generate an index signal in response to (a) a determination of a validity of said decision pattern based on a number of said hard reads and (b) a correction of said decision pattern if said decision pattern is determined to be invalid, wherein said index signal identifies one of a plurality of valid patterns that matches said decision pattern, and (iii) generate an output value by addressing a look-up table with said index signal, wherein said output value is useable in a soft decode of said data.

20. The apparatus according to claim 19, wherein said apparatus comprises a solid state drive.

* * * * *